United States Patent
Wang

(10) Patent No.: US 10,860,422 B2
(45) Date of Patent: Dec. 8, 2020

(54) METHOD FOR PERFORMING DATA MANAGEMENT IN MEMORY DEVICE, ASSOCIATED MEMORY DEVICE AND CONTROLLER THEREOF

(71) Applicant: Silicon Motion Inc., Hsinchu County (TW)

(72) Inventor: Yu-Luen Wang, Hsinchu (TW)

(73) Assignee: Silicon Motion, Inc., Hsinchu County (TW)

(*) Notice: Subject to any disclaimer, the term of this patent is extended or adjusted under 35 U.S.C. 154(b) by 22 days.

(21) Appl. No.: 16/431,679

(22) Filed: Jun. 4, 2019

(65) Prior Publication Data

US 2019/0286520 A1 Sep. 19, 2019

Related U.S. Application Data

(63) Continuation of application No. 15/654,735, filed on Jul. 20, 2017.

(30) Foreign Application Priority Data

Jan. 3, 2017 (TW) .............................. 106100011 A

(51) Int. Cl.
*G06F 11/00* (2006.01)
*G06F 11/10* (2006.01)
(Continued)

(52) U.S. Cl.
CPC ...... *G06F 11/1068* (2013.01); *G06F 11/1012* (2013.01); *G06F 11/1016* (2013.01);
(Continued)

(58) Field of Classification Search
CPC ............. G06F 11/1068; G06F 11/1012; G06F 11/1016; H03M 13/1102; H03M 13/1148
See application file for complete search history.

(56) References Cited

U.S. PATENT DOCUMENTS 8,196,025 B2* 6/2012 Lakkis ................ H03M 13/635
714/800
8,271,850 B2 9/2012 Efimov
(Continued)

FOREIGN PATENT DOCUMENTS

TW I419481 B 12/2013

OTHER PUBLICATIONS

Yeong-Luh Ueng et al., "Jointly Designed Architecture-Aware LDPC Convolutional Codes and Memory-Based Shuffled Decoder Architecture", IEEE Transactions on Signal Processing, vol. 60, No. 8, Aug. 2012, pp. 4387-4402.

*Primary Examiner* — Esaw T Abraham
(74) *Attorney, Agent, or Firm* — Winston Hsu

(57) ABSTRACT

A method for performing data management in a memory device includes: receiving a set of data from a host device positioned outside the memory device; encoding the set of data according to a first sub-matrix of a predetermined parity-check matrix to generate a partial parity-check code; performing post-processing upon the partial parity-check code according to a predetermined post-processing matrix to generate a parity-check code of the set of data, where the predetermined post-processing matrix is not equivalent to any inverse matrix of a transpose matrix of a second sub-matrix of the predetermined parity-check matrix; and writing/programming a codeword of the set of data into a non-volatile memory of the memory device to allow the memory device to perform error correction when reading the set of data from the non-volatile memory. An associated memory device and a controller thereof are also provided.

3 Claims, 6 Drawing Sheets

(51) Int. Cl.
*H03M 13/11* (2006.01)
*H03M 13/00* (2006.01)

(52) U.S. Cl.
CPC ...... *G06F 11/1024* (2013.01); *G06F 11/1044* (2013.01); *G06F 11/1048* (2013.01); *H03M 13/1102* (2013.01); *H03M 13/1148* (2013.01); *H03M 13/611* (2013.01); *H03M 13/616* (2013.01)

(56) References Cited

U.S. PATENT DOCUMENTS

| | | |
|---|---|---|
| 8,301,979 B2 | 10/2012 | Sharon |
| 8,433,984 B2 * | 4/2013 | Khandekar ......... H03M 13/616 714/779 |
| 8,578,239 B2 | 11/2013 | Katayama |
| 8,578,252 B2 | 11/2013 | Okamura |
| 8,924,814 B2 | 12/2014 | Feldman |
| 8,954,831 B2 * | 2/2015 | Anholt ................. H03M 13/114 714/801 |
| 9,189,328 B2 * | 11/2015 | Kim .................... G06F 11/1012 |
| 9,213,599 B2 | 12/2015 | Wu |
| 9,213,600 B2 | 12/2015 | Cohen |
| 9,262,268 B2 | 2/2016 | Cai |
| 9,553,611 B2 * | 1/2017 | Teitel ................. H03M 13/1148 |
| 9,853,661 B2 * | 12/2017 | Tate ................... H03M 13/1128 |
| 10,289,348 B2 * | 5/2019 | Bear ................. H03M 13/1117 |
| 10,382,069 B2 * | 8/2019 | Teitel ................. H03M 13/616 |
| 2012/0240008 A1 | 9/2012 | Obata |
| 2013/0117503 A1 | 5/2013 | Nellans |
| 2016/0248543 A1 | 8/2016 | Myung |

* cited by examiner

METHOD FOR PERFORMING DATA MANAGEMENT IN MEMORY DEVICE, ASSOCIATED MEMORY DEVICE AND CONTROLLER THEREOF

CROSS REFERENCE TO RELATED APPLICATIONS

This application is a continuation application of the U.S. Non-Provisional application Ser. No. 15/654,735 filed on Jul. 20, 2017. The entire contents of the related application are included herein by reference.

BACKGROUND OF THE INVENTION

1. Field of the Invention

The present invention relates to flash memory access, and more particularly, to performing data management in a memory device.

2. Description of the Prior Art

Developments in memory technology have led to the wide application of portable memory devices, such as memory cards which conform to the SD/MMC, CF, MS and XD specifications, respectively. Improving access control of memories in these portable memory devices remains an issue to be solved in the art.

NAND flash memories may comprise single level cell (SLC) and multiple level cell (MLC) flash memories. In an SLC flash memory, each transistor used as a memory cell may have any of two electrical charge values, respectively representing the logic values 0 and 1. The storage ability of each transistor used as a memory cell in an MLC flash memory may be fully utilized, where the transistor may be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

Compared with the SLC flash memory, the lower cost and larger capacity of the MLC flash memory means it is more likely to be applied in portable memory devices. The MLC flash memory does have instability issues, however. To ensure that access control of the flash memory in the portable memory device meets related specifications, a controller of the flash memory is usually configured to have management mechanisms to properly manage the access of data.

Related art memory devices with the above management mechanisms still have some disadvantages. The error rate of the MLC flash memory may be greatly increased under some circumstances, such that traditional error correction mechanisms are unable to deal with the resultant burst error. Hence, there is a need for a novel memory access design having both error correction mechanism and data access mechanism.

SUMMARY OF THE INVENTION

An objective of the present invention is to provide a memory device, a method for performing data management in the memory device, and an associated controller, in order to solve the problems of the related arts.

Another objective of the present invention is to provide a memory device, a method for performing data management in the memory device, and an associated controller, which can enhance the performance of the memory device.

At least one embodiment of the present invention provides a controller of a memory device. The memory device comprises the controller and a non-volatile memory. The non-volatile memory comprises at least one non-volatile memory chip, and the controller comprises a processing circuit and a data protection circuit. The processing circuit is arranged to control the controller to receive a set of data from a host device positioned outside the memory device. The data protection circuit is coupled to the processing circuit, and is arranged to perform error correction. The data protection circuit encodes the set of data according to a first sub-matrix of a predetermined parity-check matrix to generate a partial parity-check code. The data protection circuit performs post-processing upon the partial parity-check code according to a predetermined post-processing matrix to generate a parity-check code of the set of data, wherein the predetermined post-processing matrix is not equivalent to any inverse matrix of a transpose matrix of a second sub-matrix of the predetermined parity-check matrix. The processing circuit controls the controller to write a codeword of the set of data into the non-volatile memory to allow the memory device to perform error correction when reading the set of data from the non-volatile memory, wherein the codeword comprises the set of data and the parity-check code.

By properly performing data management, the present invention may properly perform memory access management upon the data accessed by the controller, which thereby reduces the error rate. Further, implementing according to the embodiments of the present invention will not greatly raise the cost.

These and other objectives of the present invention will no doubt become obvious to those of ordinary skill in the art after reading the following detailed description of the preferred embodiment that is illustrated in the various figures and drawings.

DETAILED DESCRIPTION

I. The Memory System

Figure 1:
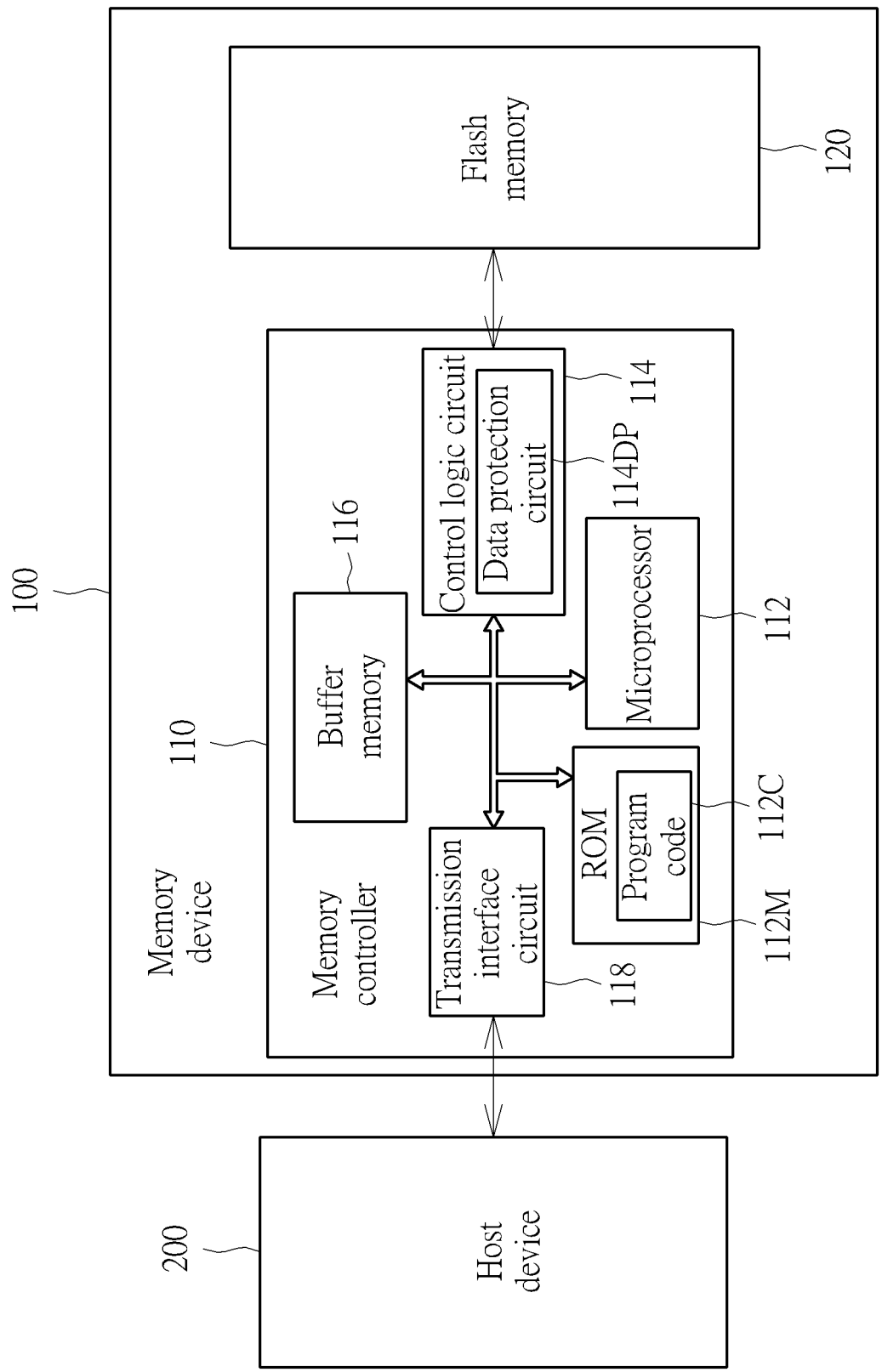
FIG. 1 is a diagram of a memory device and a host device according to a first embodiment of the present invention.

FIG. 1 is a diagram of a memory device 100 and a host device 200 according to a first embodiment of the present invention. The memory device 100 may be a portable memory device (e.g. a memory card conforming to the SD/MMC, CF, MS or XD specification) or a solid state drive (SSD). In addition, examples of the host device 200 may comprise (but are not limited to): a multifunctional mobile phone, tablet, wearable device, and a personal computer. According to this embodiment, the memory device 100 may comprise a controller and a non-volatile memory, where the non-volatile memory is arranged to store information, the controller is arranged to access the non-volatile memory, and the non-volatile memory may comprise at least one non-volatile memory chip (e.g. one or more non-volatile memory chips). The controller may be a memory controller 110, and the non-volatile memory may be a flash memory 120. The flash memory 120 may comprise at least one flash memory chip (e.g. one or more flash memory chips), and the memory controller 110 may be arranged to access the flash memory 120. As shown in FIG. 1, the memory controller 110 may comprise a processing circuit such as a microprocessor 112, a storage unit (e.g. a read-only memory (ROM)) 112M, a control logic circuit 114, a buffer memory 116, and a transmission interface circuit 118, where the above components may be coupled to one another via a bus. The buffer memory 116 is implemented by a random access memory (RAM). The read-only memory 112M of this embodiment is arranged to store a program code 112C, and the microprocessor 112 is arranged to execute the program code 112C to control the access of the flash memory 120. Note that, in some examples, the program code 112C may be stored in the buffer memory 116 or any type of memory. Further, a data protection circuit 114DP in the control logic circuit 114 may protect data and/or perform error correction, and the transmission interface circuit 118 may conform to a specific communications specification (e.g. the Serial Advanced Technology Attachment (SATA) specification, or Universal Serial Bus (USB)) specification), and may perform communications according to the specific communications specification.

In this embodiment, the host device 200 may transmit commands and corresponding logical addresses to the memory controller 110 to access the memory device 100. The memory controller 110 receives the commands and the logical addresses, and controls the flash memory 120 to perform reading, writing/programming or erasing upon the memory units having physical addresses within the flash memory 120, where the physical addresses correspond to the logical addresses.

II. Page Address Linking Table

Figure 2A:
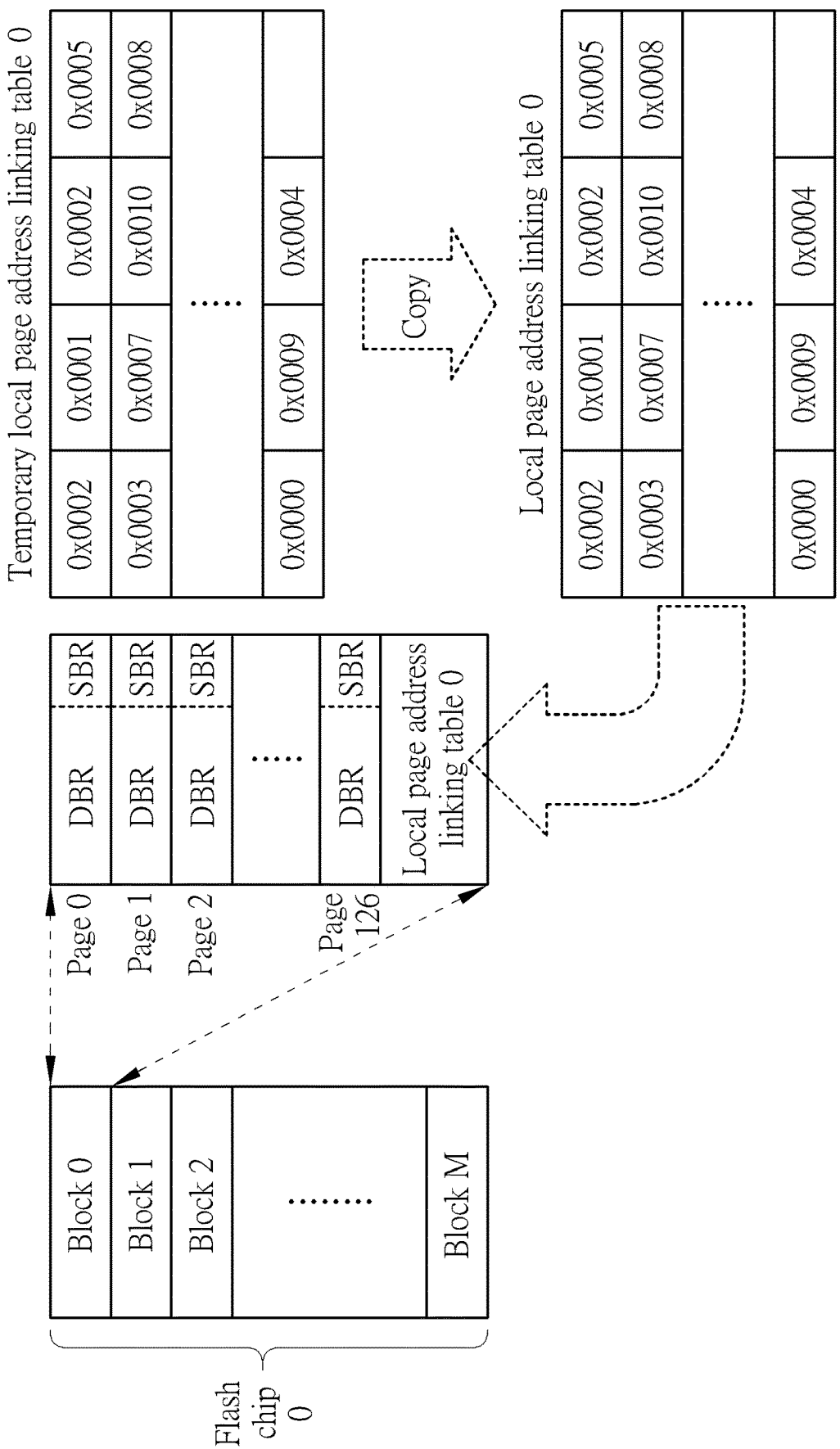
FIG. 2A illustrates a local page address linking table in a block of a flash chip.

FIG. 2A illustrates a local page address linking table in a block of a flash chip 0, where the flash chip 0 may be an example of the flash memory chip mentioned above. As shown in FIG. 2A, the flash chip 0 comprises a plurality of blocks 0, 1, 2, . . . , and M. Note that a block is used as an erasing unit. In other words, when there is a need for erasing data, the microprocessor 112 may simultaneously erase all data stored in the block. In addition, a block, such as the block 0 shown in FIG. 2A, may comprise a plurality of pages. For example, the block 0 of the flash chip 0 comprises 128 pages. In the block (such as block 0), the pages are divided into two areas, where one is a data area for storing data, and the other is a table area for storing a local page address linking table 0. The pages in the data area of the block may be called the data pages of the block, where any of the data pages may comprise a data byte region DBR and a spare byte region SBR.

According to this embodiment, the page count of the data area and the page count of the table area may be set according to requirements. For example, the pages 0, 1, 2, . . . , 126 may be arranged to store data, and the remaining page in the block may be arranged to store the local page address linking table 0. According to some embodiments, the data area may have less than 127 pages, and the table area may comprise two or more pages. In another example, the respective page counts in the block, the data area and the table area may vary. Note that one page is a programming/writing unit. In other words, when programming writing data is required, the microprocessor 112 may program/write a page of data into one page. According to this embodiment, each block in the flash memory 120 shown in FIG. 1 may have a local page address linking table. For brevity, only the local page address linking table 0 of the block 0 of the flash chip 0 is illustrated in FIG. 2A since the functions and associated operations of the local page address linking tables of the blocks are similar to each other.

In this embodiment, the creation time of the local page address linking table 0 is the time point when all data pages in the block 0 are written (i.e. fully programmed). Before the data page in the block 0 are fully programmed, the microprocessor 112 may temporarily store a temporary local page address linking table 0 into the random access memory. When the linking relationship between a physical page address and a logical page address changes in the block 0, the microprocessor 112 may update the temporary local page address linking table 0.

Figure 2B:
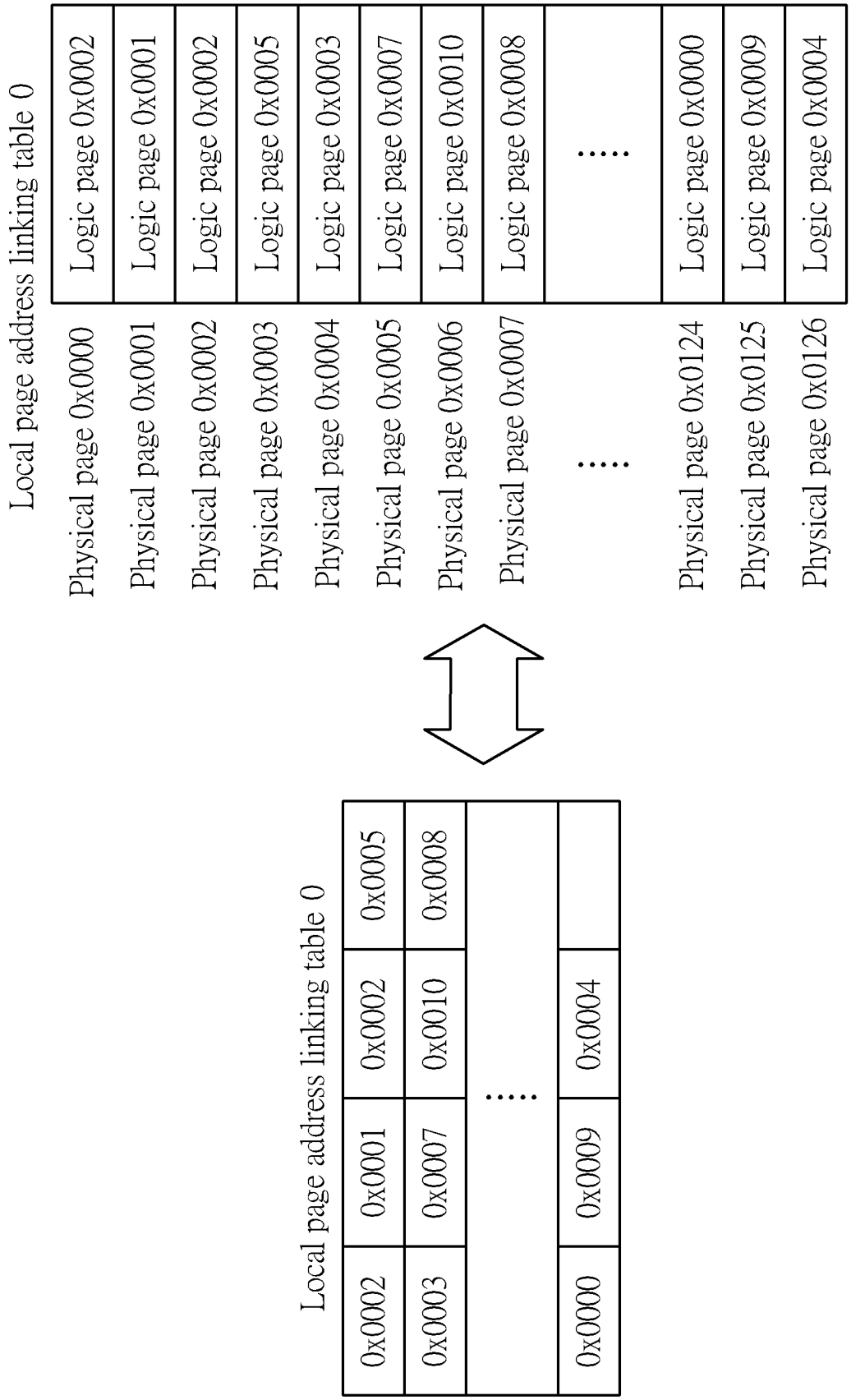
FIG. 2B compares the one-dimensional array illustration and the two-dimensional array illustration of the local page address linking table shown in FIG. 2A.

According to this embodiment, the ranking of a field (or entry) in the temporary/non-temporary local page address linking table (e.g. the temporary local page address linking table 0 or the local page address linking table 0) represents a physical page address, and the content in this field represents an associated logical page address. Assume that $i_P$ and $j_P$ are the row number and the column number of the illustrative table location ($i_P$, $j_P$) of the temporary/non-temporary local page address linking table shown in FIG. 2A, respectively, where $i_P$ may be a non-negative integer (e.g. $i_P$=0, 1, . . . ), and $j_P$ may be a non-negative integer (e.g. $j_P$=0, 1, . . . ). In this two-dimensional array illustration of the temporary/non-temporary local page address linking table shown in FIG. 2A, the illustrative table location ($i_P$, $j_P$) corresponding to the $(i_P*4+j_P)^{th}$ field represents a physical page address PPN. The physical page address PPN can be expressed as follows:

$$PPN=(PBN*DPC+i_P*4+j_P);$$

where the parameter PBN represents the physical block number of the above-discussed physical block (e.g. PBN=0, 1, 2, . . . , corresponding to the blocks 0, 1, 2, . . . , respectively), and the parameter DPC represents the data page count of each block (the data page count is 127 in this embodiment). This is merely for illustrative purposes, rather than a limitation of the present invention. For better comprehension, the temporary/non-temporary local page address linking table may be illustrated with a single column as shown in the right half of FIG. 2B. Given that $i_P$ still represents the row number and $i_P$=0, 1, . . . , in this one-dimensional array illustration shown in the right half of FIG. 2B, for the temporary/non-temporary local page address linking table of the block PBN, the illustrative table location $i_P$ corresponding to the $i_P^{th}$ field represents a physical page address (PBN*DPC+$i_P$). That is, for this one-dimensional array illustration, the above equation can be rewritten as follows:

$$PPN=(PBN*DPC+i_P).$$

When the host device 200 transmits a command to the microprocessor 112 in order to write some data at a logical page address 0x0002, the microprocessor 112 may write the data to the data byte region DBR of the page 0 of the block 0 of the flash chip 0, write the logical page address 0x0002 to the spare byte region SBR of the page 0 of the block 0 of the flash chip 0, and also write the logical page address 0x0002 to the first field of the temporary local page address linking table 0, in order to indicate that the logical page address 0x0002 is linked/mapped to the page 0 of the block 0 of the flash chip 0, where the physical page address thereof is 0x0000. The rest may be deduced by analogy. In this way, when all data pages in the block 0 are written, the microprocessor 112 may copy the latest version of the temporary local page address linking table 0 in order to create the local page address linking table 0. Note that the logical page addresses {0x0002, 0x0001, 0x0002, 0x0005, 0x0003, 0x0007, 0x0010, 0x0008, . . . , 0x0000, 0x0009, 0x0004} may be taken as an example of the logical addresses. According to some embodiments, the logical addresses may vary.

According to some embodiments, the range of the logical page addresses in a local page address linking table (e.g. the local page address linking table 0) may exceed the page count in a block (e.g. the block 0).

According to some embodiments, the microprocessor 112 may create a global page address linking table in the random access memory according to multiple local page address linking tables respectively corresponding to multiple blocks, in order to record/update the relationships between the physical addresses and the logical addresses.

III. Error Correction

The memory controller 110 may perform data management in the memory device 100 to properly solve problems in the related arts without introducing unwanted side effects, or in a way that is less likely to introduce a side effect. For example, the memory controller 110 may provide one or more types of error correction mechanisms to the memory device 100. According to some embodiments, the memory controller 110 may utilize a low-density parity-check (LDPC) code to protect data and/or perform error correction.

Figure 3:
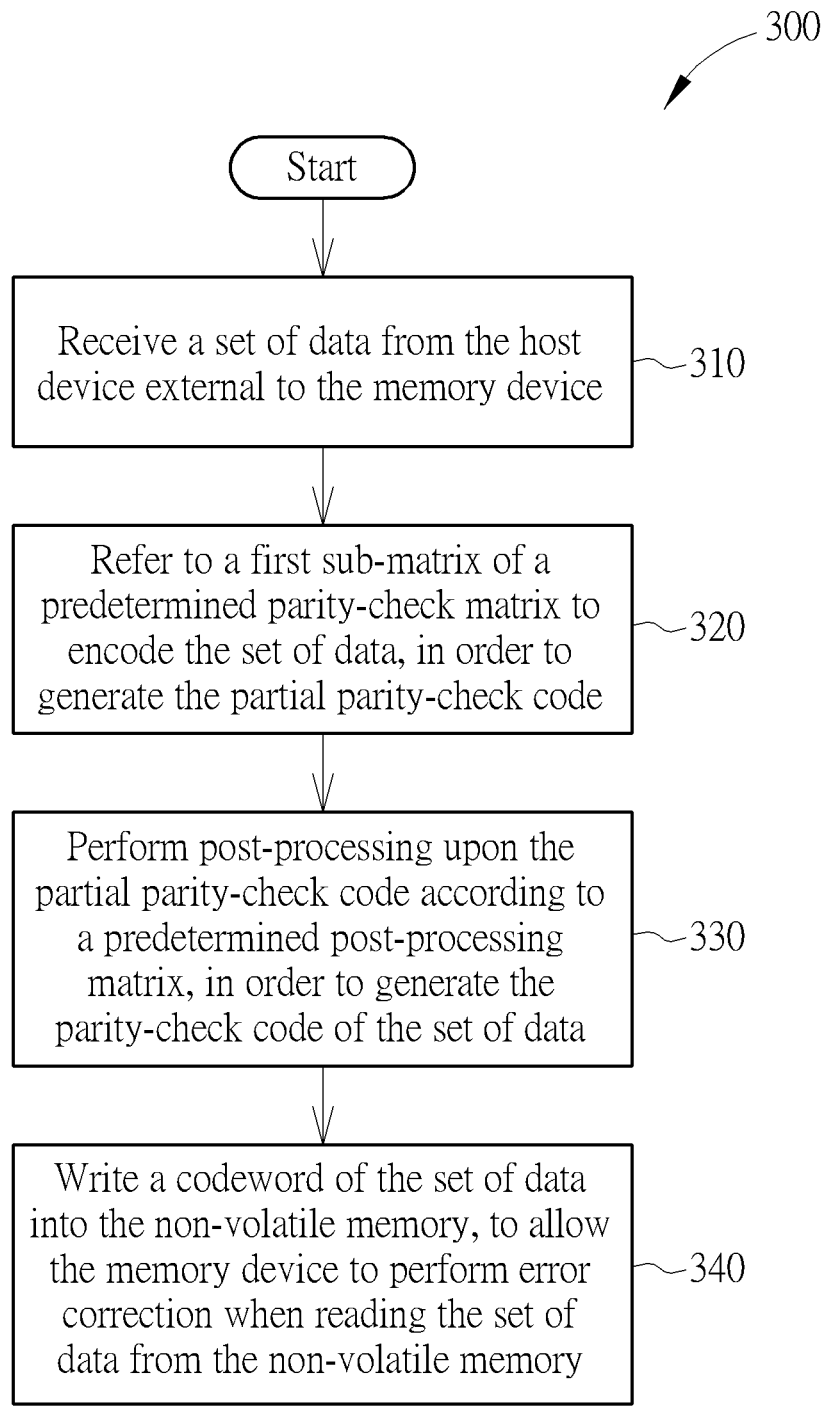
FIG. 3 is a flowchart of a method for performing data management in a memory device according to an embodiment of the present invention.

FIG. 3 is a flowchart of a method 300 for performing data management in a memory device according to an embodiment of the present invention, where the method 300 is applicable to the memory device 100, and is applicable to the aforementioned controller such as the memory controller 110.

In Step 310, under the control of the processing circuit such as the microprocessor 112, the memory controller 110 may receive a set of data m from the host device 200 positioned outside the memory device 100. The host device 200 may transmit a writing command to the memory device 100, to request the memory device 100 to store the associated write data. According to the writing command, the microprocessor 112 may control the memory controller 110 to receive the write data from the host device 200, where the write data may comprise at least one set of data (e.g. one or more sets of data) such as a plurality of sets of data {m}, and the sets of data {m} comprise the set of data m.

In Step 320, the memory controller 110 (e.g. the data protection circuit 114DP) may encode the set of data m according to a first sub-matrix $H_1$ of a predetermined parity-check matrix H, in order to generate a partial parity-check code ppc. For example, the data protection circuit 114DP may encode the one or more sets of data such as the sets of data {m} according to the first sub-matrix $H_1$ to generate one or more associated partial parity-check codes such as a plurality of partial parity-check codes {ppc}, respectively, where the partial parity-check codes {ppc} comprise the partial parity-check code ppc.

In Step 330, the memory controller 110 (e.g. the data protection circuit 114DP) may perform post-processing upon the partial parity-check code ppc according to a predetermined post-processing matrix J, in order to generate the parity-check code p of the set of data m, where the predetermined post-processing matrix J is not equivalent to any inverse matrix $((H_2)^T)^{-1}$ of the transpose matrix $(H_2)^T$ of a second sub-matrix $H_2$ of the predetermined parity-check matrix H, if the inverse matrix $((H_2)^T)^{-1}$ mentioned above exists. For example, if the inverse matrix $((H_2)^T)^{-1}$ exists, the predetermined post-processing matrix J is not equivalent to $((H_2)^T)^{-1}$. In another example, when the inverse matrix $((H_2)^T)^{-1}$ does not exist, the predetermined post-processing matrix J will not be any derivative of the transpose matrix $(H_2)^T$. For example, the data protection circuit 114DP may perform post-processing upon the one or more partial parity-check code such as the partial parity-check codes {ppc} according to the predetermined post-processing matrix J to generate one or more associated parity-check codes such as a plurality of parity-check codes {p} of the sets of data {m}, respectively, where the parity-check codes {p} comprise the parity-check code p.

In Step 340, under the control of the processing circuit such as the microprocessor 112, the memory controller 110 may write a codeword c of the set of data m into the non-volatile memory (e.g. the flash memory 120), to allow the memory device 100 to perform error correction when reading the set of data m from the non-volatile memory, where the codeword c comprises the set of data m and the parity-check code p. For example, the microprocessor 112 may control the memory controller 110 to write one or more associated codewords such as a plurality of codewords {c} of the write data into the non-volatile memory, to allow the memory device 100 to perform error correction when reading the write data from the non-volatile memory, where the codewords {c} comprise the sets of data {m} and the parity-check codes {p}.

According to some embodiments, the codeword c is equal to the multiplication result of the set of data m and a predetermined coding transformation matrix G (i.e. m·G=c). Based on a first method for performing data protection, the controller, such as the memory controller 110 (e.g. the data protection circuit 114DP), may perform a multiplication operation upon the set of data m and the predetermined coding transformation matrix G (e.g. m·G) to generate the codeword c, and may perform a multiplication operation upon the set of data m and a sub-matrix D of the predetermined coding transformation matrix G (e.g. m·D), in order to generate the parity-check code p. For example, G=[I|D], where I is a corresponding identity matrix. According to some embodiments, based on a second method for performing data protection, the controller, such as the memory controller 110 (e.g. the data protection circuit 114DP), may generate the parity-check code p according to the following equation:

$$p = m \cdot (H_1)^T ((H_2)^T)^{-1}.$$

Note that the predetermined parity-check matrix H in Step 320 is not the predetermined coding transformation matrix G, and the predetermined post-processing matrix J in Step 330 is not the predetermined coding transformation matrix G. Based on the method 300 shown in FIG. 3, the data protection circuit 114DP adopts the first sub-matrix $H_1$ of the predetermined parity-check matrix H (rather than the predetermined coding transformation matrix G) during generation of the partial parity-check code ppc, and adopts the predetermined post-processing matrix J (rather than the predetermined coding transformation matrix G) during generation of the parity-check code p. In the embodiment shown in FIG. 3, by performing the post-processing upon the partial parity-check code ppc according to the predetermined post-processing matrix J, rather than by performing any multiplication operation upon the set of data m and the predetermined coding transformation matrix G, the memory controller 110 (e.g. the data protection circuit 114DP) may generate the parity-check code p. In some embodiments, the predetermined coding transformation matrix G and the predetermined parity-check matrix H are null space with respect to each other. For example, the set of data m may comprise k bits and be denoted as the one-dimensional matrix $(m)_{1 \times k}$, the codeword c may comprise n bits and be denoted as the one-dimensional matrix $(c)_{1 \times n}$, and the parity-check code p may comprise (n−k) bits and be denoted as the one-dimensional matrix $(p)_{1 \times (n-k)}$, where k and n are positive integers and n>k. In addition, the predetermined coding transformation matrix G may be denoted as the two-dimensional matrix $(G)_{k \times n}$ and the predetermined parity-check matrix H may be denoted as the two-dimensional matrix $(H)_{(n-k) \times n}$. Further, the inner product of any row of the predetermined coding transformation matrix G and any row of the predetermined parity-check matrix H is equal to zero, which can be denoted as $G \cdot H^T = 0$ for better comprehension. In some embodiments, the set of data m, the codeword c and the parity-check code p may be denoted as the one-dimensional matrix $(m)_{1 \times k}$ the one-dimensional matrix $(c)_{1 \times n}$ and the one-dimensional matrix $(p)_{1 \times (n-k)}$, respectively, and the predetermined parity-check matrix H may be denoted as the two-dimensional matrix $(H)_{(n-k) \times n}$. The inner product of the codeword c and any row of the predetermined parity-check matrix H is equal to zero; this can be denoted as $c \cdot H^T = 0$ for better comprehension. According to some embodiments, the second sub-matrix $H_2$ may be a non-full rank matrix, where the inverse matrix $((H_2)^T)^{-1}$ of the transpose matrix $(H_2)^T$ of the second sub-matrix $H_2$ does not exist.

Compared with the first method and the second method, the method 300 shown in FIG. 3 may enhance various performance of the data protection circuit 114DP, such as the performance of encoding.

Figure 4:
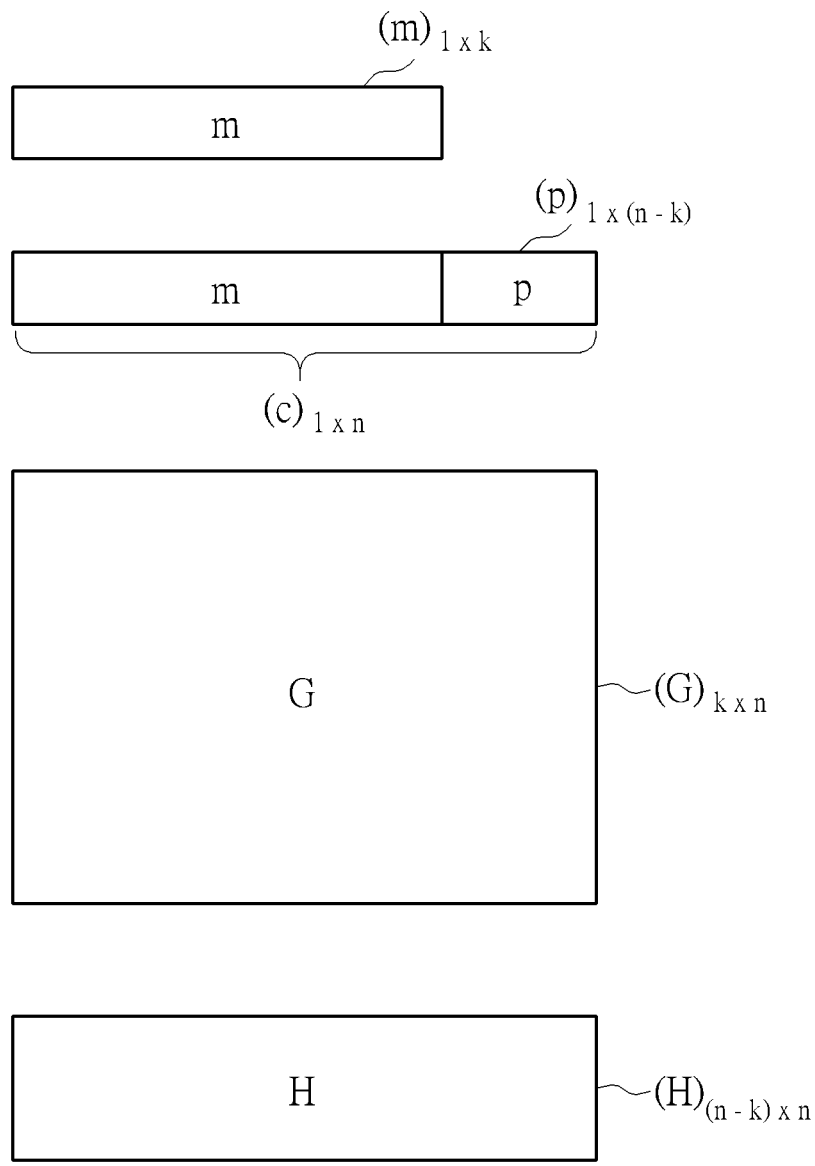
FIG. 4 illustrates the sizes of related matrices according to an embodiment of the present invention.

FIG. 4 illustrates the sizes of related matrices according to an embodiment of the present invention. The notations "k" and "n" may represent the bit count of the set of data m and the bit count of the codeword c, respectively. The bit count of the parity-check code p is equal to the bit count n of the codeword c minus the bit count k of the set of data m; this can be denoted as the difference value (n−k). In addition, the size of the predetermined parity-check matrix H is equal to the product of the difference value (n−k) and the bit count n of the codeword c; this can be denoted as ((n−k)*n). The size of the first sub-matrix $H_1$ is equal to the product of the difference value (n−k) and the bit count k of the set of data m; this can be denoted as ((n−k)*k). The size of the second sub-matrix $H_2$ is equal to the square of the difference value (n−k); this can be denoted as ((n−k)*(n−k)).

According to some embodiments, under the control of the processing circuit such as the microprocessor 112, the memory controller 110 may read the codeword c from the non-volatile memory (e.g. the flash memory 120) in order to generate the readout data of the codeword c. The memory controller 110 (e.g. the data protection circuit 114DP) may determine whether the readout data is correct according to the predetermined parity-check matrix H. The data protection circuit 114DP may comprise a read-only memory for storing the predetermined parity-check matrix H. In some examples, the predetermined parity-check matrix H may be stored in the read-only memory 112M or any of other memories. When the readout data is determined to be correct, the memory controller 110 (e.g. the processing circuit such as the microprocessor 112) may control the memory device 100 to output the set of data m carried by the readout data; otherwise, the data protection circuit 114DP may perform error correction according to the readout data in order to recover the set of data m. In response to a read command of the host device 200, the microprocessor 112 may control the memory device 100 to output the set of data m (e.g. the set of data m carried by the readout data, or the set of data m recovered via the error correction).

Figure 5:
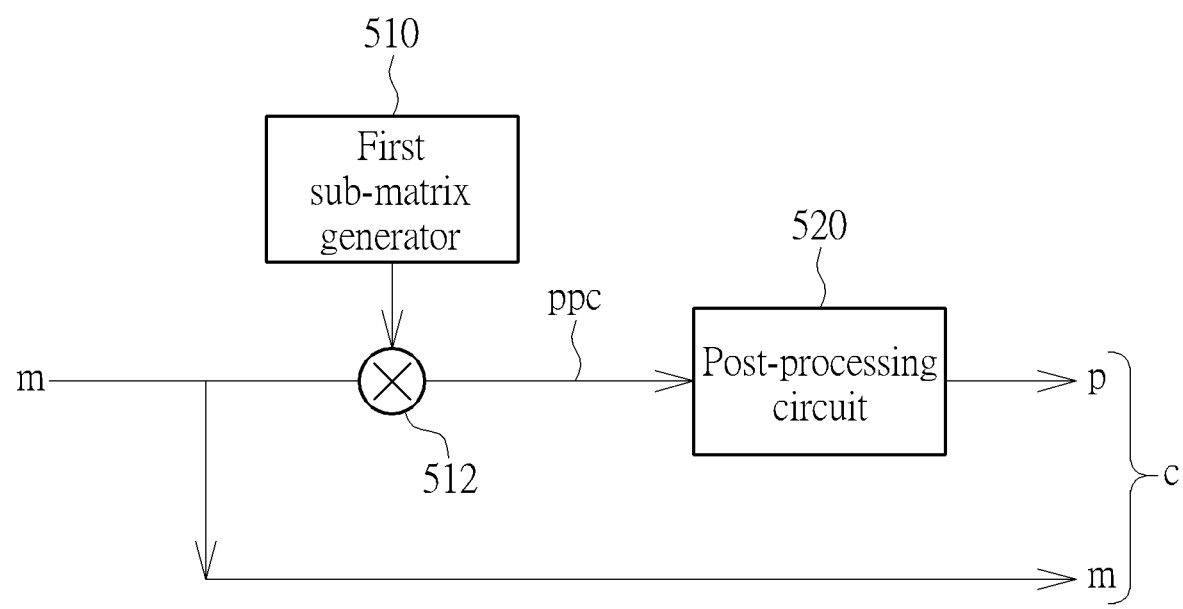
FIG. 5 illustrates a coding circuit according to an embodiment of the present invention.

FIG. 5 illustrates a coding circuit 500 according to an embodiment of the present invention, where the coding circuit 500 may be positioned in the data protection circuit 114DP shown in FIG. 1. The coding circuit 500 may comprise a first sub-matrix generator 510 (which may also be referred to as the $H_1$ generator in this embodiment), a multiplication circuit 512 and a post-processing circuit 520. The first sub-matrix generator 510 may comprise a read-only memory storing the first sub-matrix $H_1$. The first sub-matrix generator 510 may output the elements of the first sub-matrix $H_1$ to the multiplication circuit 512 according to a predetermined order. The multiplication circuit 512 may receive the set of data m and the first sub-matrix $H_1$, and may perform a multiplication operation (e.g. $m \cdot (H_1)^T$) in order to generate the partial parity-check code ppc. For example, $ppc = m \cdot (H_1)^T$. The post-processing circuit 520 may perform post-processing upon the partial parity-check code ppc according to the predetermined post-processing matrix J, in order to generate the parity-check code p. The post-processing may comprise a multiplication operation (e.g. ppc·J) as well as follow-up operations. For better comprehension, the post-processing may be denoted as f(ppc·J), where the symbol f( ) may represent the above-mentioned follow-up operations. According to some embodiments, the architecture shown in FIG. 5 may vary.

According to some embodiments, the architecture shown in FIG. 1 and the method 300 shown in FIG. 3 may vary. For example, the post-processing may comprise a randomizing operation, a data protection operation similar to that of a redundant array of independent disks (RAID), and any linear transformation, where the post-processing circuit 520 may comprise the associated sub-circuits such as a randomizer circuit, etc. In addition, the architecture for decoding may be modified correspondingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A controller of a memory device, the memory device comprising the controller and a non-volatile memory, the non-volatile memory comprising at least one non-volatile memory chip, the controller comprising:

a processing circuit, arranged to control the controller to receive a set of data from a host device positioned outside the memory device; and a data protection circuit, coupled to the processing circuit, the data protection circuit arranged to perform error correction, wherein:

the data protection circuit encodes the set of data according to a first sub-matrix of a predetermined parity-check matrix, to generate a partial parity-check code; and the data protection circuit performs post-processing upon the partial parity-check code according to a predetermined post-processing matrix, to generate a parity-check code of the set of data, wherein the predetermined post-processing matrix is not equivalent to any inverse matrix of a transpose matrix of a second sub-matrix of the predetermined parity-check matrix;

wherein the processing circuit controls the controller to write a codeword of the set of data into the non-volatile memory, to allow the memory device to perform error correction when reading the set of data from the non-volatile memory, wherein the codeword comprises the set of data and the parity-check code.

2. The controller of claim 1, wherein the codeword is equal to a multiplication result of the set of data and a predetermined coding transformation matrix; and the predetermined parity-check matrix is not the predetermined coding transformation matrix.

3. The controller of claim 1, wherein the codeword is equal to a multiplication result of the set of data and a predetermined coding transformation matrix; and the predetermined post-processing matrix is not the predetermined coding transformation matrix.

* * * * *